United States Patent [19]

Du Chene et al.

[11] Patent Number: 4,982,403
[45] Date of Patent: Jan. 1, 1991

[54] ELECTRICAL CIRCUIT TESTING DEVICE AND CIRCUIT COMPRISING THE SAID DEVICE

[75] Inventors: Arnaud Du Chene, Bernard Dias; both of Paris, France

[73] Assignee: Thomson-CSF, Paris, France

[21] Appl. No.: 490,510

[22] Filed: Mar. 1, 1990

Related U.S. Application Data

[63] Continuation of Ser. No. 156,823, Feb. 17, 1988, abandoned.

[30] Foreign Application Priority Data

Feb. 17, 1987 [FR] France ............................ 87 02003

[51] Int. Cl.$^5$ ............................................. G01R 31/28
[52] U.S. Cl. ................................................... 371/22.4
[58] Field of Search ............................. 371/22.4, 15.1; 324/73.1

[56] References Cited

U.S. PATENT DOCUMENTS

| | | | |
|---|---|---|---|
| 4,513,418 | 4/1985 | Bardell, Jr. et al. | 371/25 |
| 4,571,724 | 2/1986 | Belmondo et al. | 371/22.1 |
| 4,601,034 | 7/1986 | Sridhar | 371/25 |
| 4,701,916 | 10/1987 | Naven et al. | 371/15 |
| 4,703,484 | 10/1987 | Rolfe et al. | 371/25 |
| 4,724,380 | 2/1988 | Burrows et al. | 324/73 R |
| 4,764,926 | 8/1988 | Knight et al. | 371/25 |
| 4,779,273 | 10/1988 | Beucler et al. | 371/25 |

OTHER PUBLICATIONS

Bhavsar et al., Self-Testing by Polynomial Division, 1981 Int'l. Test Conference, IEEE, pp. 208-216.
IBM Technical Disclosure Bulletin, vol. 25, No. 10, Mars 1983, pp. 4958-4960, New York, U.S.; P. S. Bottorff et al.: "Self-Testing Scheme Using Shift Register Latches".
IBM Technical Disclosure Bulletin, vol. 26, No. 3B, About 1983, pp. 1604-1606, New York, U.S.; D. A. Calvin: "Design for Self-Test SRL Implementation".
IBM Technical Disclosure Bulletin, vol. 26, No. 10B, Mars 1984, pp. 5566-5570, New York, U.S.; A. Blum: "Self-Testing Mechanism".

Primary Examiner—Charles E. Atkinson
Attorney, Agent, or Firm—Oblon, Spivak, McClelland, Maier & Neustadt

[57] ABSTRACT

A device for the testing of electrical circuits and a circuit comprising the said device are disclosed. The testing device is used to test electrical circuits by the generation of test vectors and the compression of the signal at the output of the device to be tested. The device of the present invention uses the same shift register, certain cells of which are looped at the input, by means of an exclusive-OR logic gate, to generate test vectors and perform signature analysis. Thus it is possible to test electrical circuits themselves as well as the input/output buses. The invention can be applied, in particular, to the testing of computers, microprocessors, memories, fast Fourier transform calculators, adders, multipliers, combinational logic systems or circuits including combinational logic systems or circuits that have internal memorizing devices.

8 Claims, 4 Drawing Sheets

FIG_1
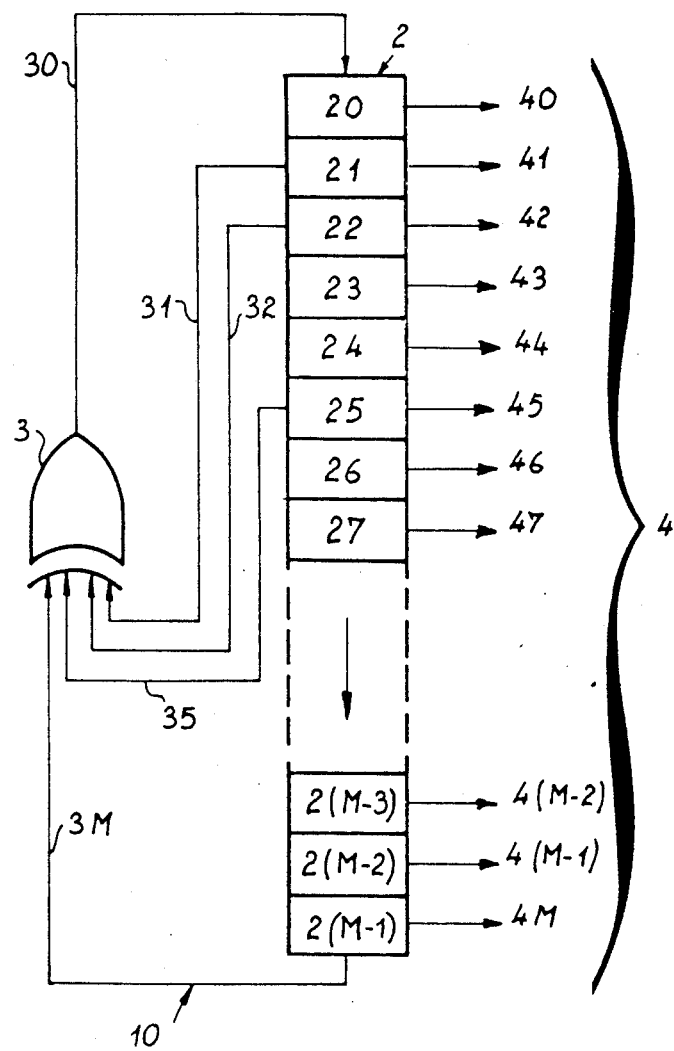

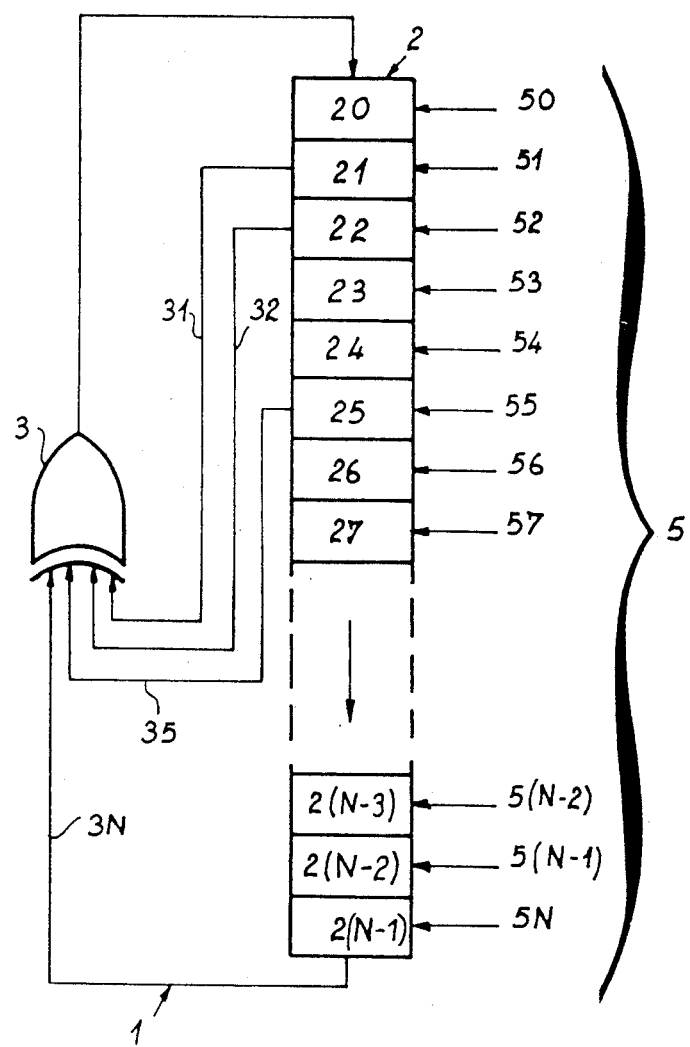
FIG_2

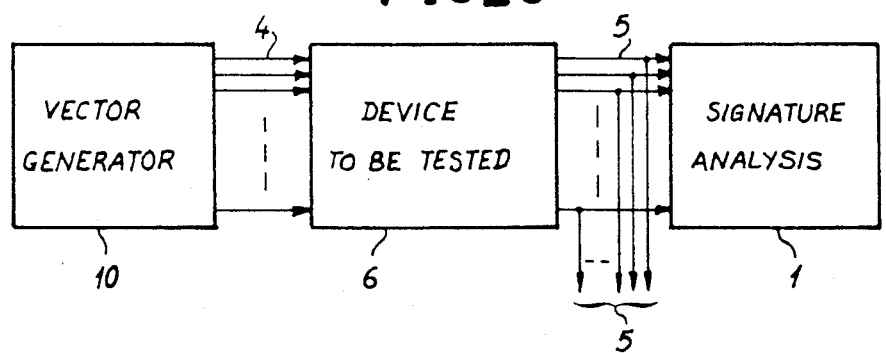
FIG_3
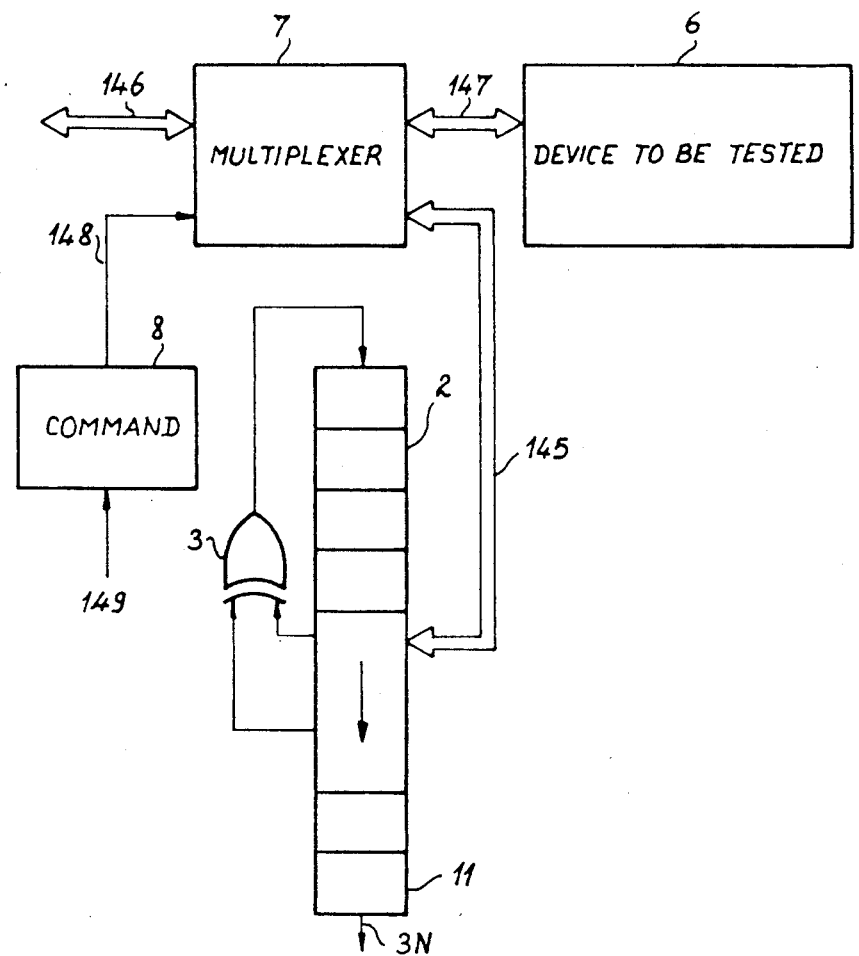
FIG_4

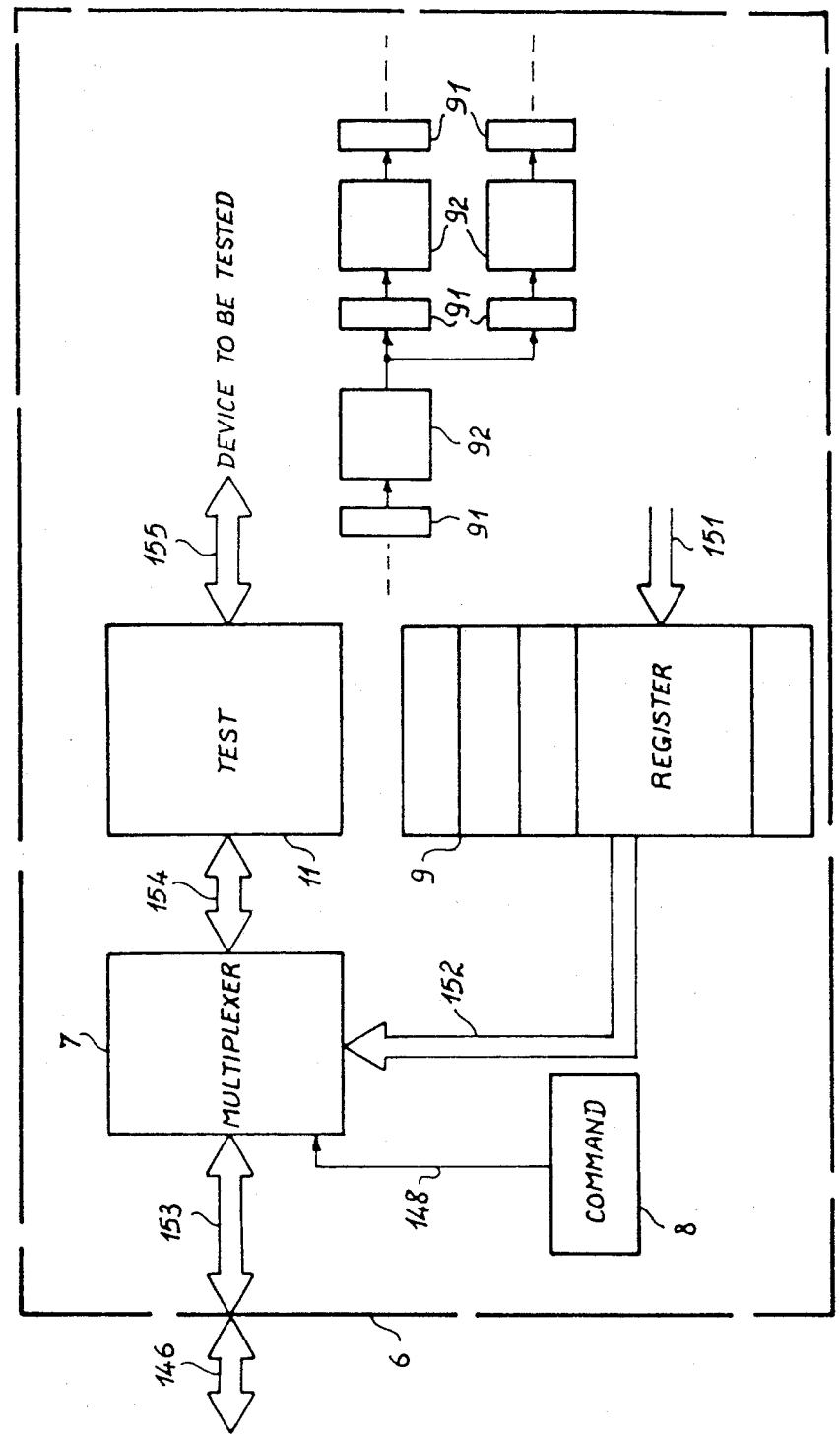

ELECTRICAL CIRCUIT TESTING DEVICE AND CIRCUIT COMPRISING THE SAID DEVICE

This application is a continuation of application Ser. No. 01/156,823, filed on Feb. 17, 1988, now abandoned.

BACKGROUND OF THE INVENTION

1. Field of the Invention

The main object of the present invention is an electrical circuit testing device and a circuit comprising the said device.

The present invention pertains chiefly to tests on the correct functioning of electrical circuits such as, for example, digital and/or logic circuits. It can be used to detect the malfunctioning of an integrated circuit, a printed circuit or any other electronic device. Once the malfunction is detected, measures can be taken to reduce the consequences of the malfunction to the minimum. For example, the malfunctioning electrical circuit may be replaced, or the result given by the said circuit may be ignored.

2. Description of the Prior Art

The increasing complexity of electronic circuits is making it increasingly difficult to test these circuits exhaustively so as to detect all malfunctions with certainty. There are known methods of conducting tests with very high chances of detecting a malfunction in a circuit. In particular, in one prior art method, sequences of long pseudo-random vectors are injected into the digital and/or logic circuit. The long pseudo-random sequences are obtained by re-looping certain cells of a shift register through an exclusive-OR gate. By using Nth degree generating polynomials, sequences with a length of $2^N - 1$ can be obtained.

At the output of the device to be tested, it suffices to verify that the results obtained conform with those that should be given by a board in good working order. For example, the result obtained is compared with those given by a board which is known to function perfectly, or else with results obtained by simulation.

An improved method consists in using signature analysis. This method is called the BILBO method. Another shift register is connected to the output of the device to be tested. Certain cells of this shift register are re-looped through an exclusive-OR gate. This second shift register, provided with its exclusive-OR logic gate, makes it possible to compress the data obtained. At the end of the test, it suffices to compare the contents of the shift register with those that would be obtained for a device in perfect working order to ascertain, with very high efficiency, that the tested device is malfunctioning or not malfunctioning.

The prior art type of device has the disadvantage of not conducting tests on the input/output bus of the device.

SUMMARY OF THE INVENTION

The device of the present invention uses a single shift register looped through an exclusive-OR logic gate to generate test vectors as well as to compress data. This device is connected to the input/output bus of the system to be tested. Thus it can be used to detect jamming at 0 or jamming at 1 on this bus. However, it cannot be used to detect bus disconnections. The device of the present invention comprises a multiplexer which can be used to send the data present at the output of the device to be tested towards the shift register.

Furthermore, the use of a single shift register to generate test vectors and to compress the responses given by the device to be tested reduces the quantity of equipment needed to perform the test. This reduction will be especially great as compared with the total equipment in testing devices included in integrated circuits.

The use of one and the same shift register to generate test vectors and compress data results in modifying the contents of the shift register between the generation of two vectors of successive tests, as compared with the contents of shift registers in the functioning of a prior art type of test generator. In theory, it might have been expected that there would be a great reduction in the efficiency of the tests, namely in the number of malfunctions detected as compared with the number of real malfunctions. Experiments have proved that it is possible to obtain an efficiency rate higher than 99%, for example, 99.6%.

In an alternative embodiment of the device according to the present invention, the testing device is included in the device to be tested, for example an integrated circuit or a printed circuit.

In a second alternative embodiment of the device according to the present invention, this device is common to a set of equipment. It is possible to test a particular piece of equipment by connecting it to a common input/output bus.

In a third alternative embodiment, the testing device according to the present invention is autonomous. It can be connected to any piece of equipment in order to test the said equipment.

The main object of the invention is a testing device for electrical circuits and, especially, for digital and/or logic circuits comprising a shift register, at least one cell of which is connected to the inputs of an exclusive-OR logic gate, the output of the said exclusive-OR logic gate being connected to the input of the said shift register, wherein the shift register can be connected to the input of the device to be tested in order to generate test vectors and to the output of the device to be tested in order to compress the data available at the output, so as to provide for the signature analysis of the said device to be tested.

BRIEF DESCRIPTION OF THE DRAWINGS

The invention will be better understood from the following description and the figures, given as non-exhaustive examples, of which:

FIG. 1 is a diagram of a known type of test vector generator;

FIG. 2 is a diagram of a known type of data-compressing device;

FIG. 3 is a diagram of a BILBO type of testing device;

FIG. 4 is a diagram of a first embodiment of the device according of the present invention;

FIG. 5 is a diagram of a second embodiment of the device according to the present invention.

DESCRIPTION OF PREFERRED EMBODIMENTS

In FIGS. 1 to 5, the same references are used to designate the same elements.

FIG. 1 is a schematic diagram of a generator 10 of pseudo-random signals. The said generator comprises a shift register 2 comprising M cells, marked 20 to 2(M-1), and an exclusive-OR logic gate 3. At each clock pulse (not shown), the shift register 2 shifts the data present in a cell in the direction represented by the rising order of reference numbers. Thus, after M clock cycles, a datum presented at the input of the cell 20 is present at the output of the cell 2(M-1). The cell 2(M-1) is connected to one of the inputs of the exclusive-OR logic gate 3 by a line 3M. The output of the exclusive-OR logic gate 3 is connected by a line 30 to a cell 20. Certain cells of the shift register 2 are connected to the inputs of the exclusive-OR logic gate 3. In the example of the register shown in FIG. 1, the cell 21 is connected by the line 31 to an input of the exclusive-OR logic gate 3, the cell 22 is connected by the line 32 to an input of the exclusive-OR logic gate 3, and the cell 25 is connected by the line 35 to an input of the exclusive-OR logic gate 3.

Table 1 gives the non-trivial exponents of the generating polynomials making it possible, for a shift register comprising M cells, to obtain $2^M-1$ different M-bit words.

TABLE 1

| Generating polynomials | |
|---|---|
| Degrees | Non-trivial exponents |
| 16 | 9, 7, 4 |
| 20 | 3 |
| 21 | 2 |
| 22 | 1 |
| 23 | 5 |
| 24 | 24, 7, 2, 1 |
| 25 | 3 |
| 26 | 6, 2, 1 |
| 27 | 5, 2, 1 |
| 28 | 3 |
| 29 | 2 |
| 30 | 23, 2, 1 |
| 31 | 3 |
| 32 | 22, 2, 1 |
| 33 | 13 |

Thus, for example, if we wish to use the 27th generating polynomial:

$$P_{27}(X)=X^{27}+X^5+X^2+X+1,$$

we will use a shift register 1 comprising 27 cells.

In this case, in addition to the first cell 2(M-1) which is still looped to an input of the exclusive-OR logic gate 3, we will re-loop the second, third and sixth cells, respectively marked 21, 22 and 25 in FIG. 1.

The M-bit words are available at the outputs 4 of the shift register 2. In the example shown in FIG. 1, the outputs of the shift register 2 are marked 40 to 4(M-1)

FIG. 2 shows the schematic diagram of a data compression device used for signature analysis for tests on electrical circuits.

The device shown in FIG. 2 has a shift register with N cells, marked 20 to 2(N-1), and an exclusive-OR logic gate 3. At each clock pulse (not shown), the shift register 2 shifts the data which is present in the cells, in a direction represented by the rising order of reference numbers, and which is modified by an exclusive-OR function by the corresponding signal 5. The cell 2(N-1) is connected to one of the inputs of the exclusive-OR logic gate 3 by a line 3N. The output of the exclusive-OR logic gate 3 is connected by a line 30 to the cell 20. Certain cells of the shift register 2 are connected to inputs of the exclusive-OR logic gate 3. In the example shown in FIG. 2, the cell 21 is connected by the line 31 to an input of the exclusive-OR gate 3, the cell 22 is connected by the line 32 to an input of the exclusive-OR logic gate 3 and the cell 25 is connected by the line 35 to the input of the exclusive-OR logic gate 3.

The data to be compressed are entered in a shift register 2 by means of the inputs 5. In FIG. 2, the inputs 5, corresponding to the cells 20 to 2(N-1), are marked 50 to 5(N-1). The result of the compression is read either, in parallel, by means of the inputs 5 or serially by means of the line 3N which is connected to the last cell of the shift register 2, 2(N-1).

FIG. 3 shows an example of a BILBO type of testing device. The inputs of the device to be tested, for example an integrated circuit, are connected to the outputs 4 of the test vector generator 10 which is, for example, similar to the test vector generator shown in FIG. 1.

The outputs of the device to be tested are connected to the inputs 5 of the signature analysis device. The signature analysis device 1 is, for example, similar to the device illustrated in FIG. 2. In the example illustrated in FIG. 3, the outputs 5 can be read outside, making it possible, at the end of the test, to read the values contained in the shift register 2.

FIG. 4 shows an example of an embodiment of the device according to the invention. In the example of FIG. 4, the device to be tested 6 is normally connected to an external input/output bus 146. To make it possible to test the device to be tested 6 at any instant, the bus 146 is connected to a multiplexer 7. The multiplexer 7 is connected to the device to be tested 6 by means of a bus 147 and to a testing device 11 by a bus 145. The testing device 11 comprises a shift register 2, certain cells of which are re-looped by an exclusive-OR gate 3 at its input. The cells of the shift register 2 can be read and written in parallel by means of the bus 145.

The multiplexer 7 makes it possible to connect either the bus 146 to the bus 147 or the bus 145 to the bus 147. The multiplexer 7 comprises, for example, three-state devices.

At the first clock cycle, the shift register 2 is initialized. For example, all the cells of the shift register 2 have the value 1. At one in every two clock cycles, for example during the even-numbered clock cycles, the testing device 11 sends test vectors through the bus 145, the multiplexer 7 and the bus 147 to the inputs of the device to be tested 6. During the complementary clock cycles, namely, in our example, during the odd-numbered clock cycles, the shift register 2 of the testing device 11 receives, through the bus 147, the multiplexer 7 and the bus 145, the output values generated, in response to the test vectors, by the device to be tested 6.

Thus the test vectors generated by the device 11 are the modified responses to the previous test vectors of the device 6. It must be noted that the device 11 will no longer generate $2^N$ different N-bit vectors for the test. Nevertheless, in most cases, it has been experimentally verified that an almost exhaustive test is obtained. In particular, this has been verified for the generating polynomials $F(X)=X^{33}+X^{13}+1$ and for the polynomial $X^{47}+1$. This polynomial has the additional advantage of requiring few connections at the exclusive-OR logic gate 3.

The result of the test is read either by a serial bus 3N connected to the last output of the shift register 2 or, advantageously, by means of the bus 145, the multiplexer 7 and the bus 146.

The control device 8 makes it possible to control the multiplexer 7.

Outside testing periods, the bus 146 is connected by the multiplexer 7 to the bus 147. The testing device 11 is perfectly transparent to the user. During the testing period, the control device 8 performs the necessary commutations. For example, the control devices 8 comprises counters which can be used to measure the number of cycles performed. Advantageously, the control device 8 comprises a logic circuit which makes it possible to automate the test. The test is done either periodically or upon a command 149 of the control device 8.

FIG. 5 shows a second example of the device according to the invention. In the example shown in FIG. 5, the testing device is integrated into the device to be tested. For example, the device to be tested 6 is an integrated circuit that does the fast Fourier transform (FFT). The external input/output bus 146 is connected to the internal input/output bus 153. The internal input/output bus 153 is connected to the multiplexer 7. The multiplexer 7 is connected, firstly, to the bus 154 and, secondly, to the bus 152. The bus 154 is a bi-directional bus connecting the mutiplexer 7 to the testing device 11. The testing device 11 is connected to an internal bus 155.

The bus 152 is, for example, the internal output bus of the device to be tested 6. Advantageously, the internal output bus 151 is connected to a register 9 which is itself connected to the bus 152.

A control device 8 is connected by a bus 148 to the multiplexer 7.

The multiplexer 7 makes it possible either to connect the bus 146 to the bus 155 through the bus 153 and 154, or to connect the bus 151 to the test device 11 through the bus 152 and 154. The former case corresponds to the normal working of the device to be tested 6. In this case, it is advantageous to use the shift register 2 of the testing device 11 as an input/output buffer register of the device to be tested 6.

The second example corresponds to the testing of the device to be tested 6.

In an especially advantageous alternative embodiment of the invention, the multiplexer 7 can be used to switch over the signals of the bus 152 towards the bus 154, without at all insulating the bus 154 from the bus 153 which is connected to the bus 146. Thus, any jamming at 0 or at 1 gives bits of the bus 146 or the bus 153, modifying the contents of the register 2 of the testing device 11. This jamming at 0 or 1 will therefore be detected as a functioning fault in the device to be tested 6.

The invention can be applied chiefly to the testing of electrical circuits, especially digital and/or logic circuits.

The invention can be applied, in particular, to tests on integrated circuits, printed circuits and any device that uses signal processing.

The invention can be applied, in particular, to tests on computers, microprocessors, memories, fast Fourier transform calculators, adders, multipliers, combinational logic systems or circuits including combinational logic systems that have internal memorizing devices.

What is claimed is:

1. A testing device for an electrical circuit device to be tested and especially, for digital and/or logical circuits to be tested, said testing device comprising:
   a shift register having a serial input and comprising a plurality of serially connected cells;
   means for connecting at least one of said cells to the input of said shift register;
   an external input/output bus to be connected to said device to be tested;
   multiplexer means for connecting said device to be tested to said input/output bus during normal operation of said device and for connecting said device to be tested to said shift register, without insulating said bus from said shift register, during testing operation.

2. A testing device according to claim 1 wherein only one cell is connected to said input of said shift register and wherein said connecting means comprise only a direct connection between said one cell and said input of said shift register.

3. A testing device according to claim 1, wherein at least two cells are connected to said input of said shift register and wherein said connecting means comprise an exclusive-OR logic gate.

4. A testing device according to claim 3, wherein the cells of said shift register, connected to the exclusive-OR logic gate inputs, correspond to the non-trivial exponents of a generating polynomial.

5. A testing device according to claim 1, further comprising a multiplexing controller device connected to said multiplexer means.

6. A testing device according to claim 1, wherein said testing device is a printed circuit.

7. A testing device according to claim 1, wherein said testing device is an integrated circuit.

8. A testing device according to claim 1, wherein said testing device comprises a combinational circuit.

* * * * *